(12) United States Patent
Munoz

(10) Patent No.: US 10,175,086 B2
(45) Date of Patent: Jan. 8, 2019

(54) DEVICE AND METHOD FOR MEASURING THE HEIGHT OF A LIQUID IN A CONTAINER

(71) Applicant: AKWEL SA, Champfromier (FR)

(72) Inventor: Régis Munoz, Saint Rambert d'Albon (FR)

(73) Assignee: AKWEL SA, Champfromier (FR)

( * ) Notice: Subject to any disclaimer, the term of this patent is extended or adjusted under 35 U.S.C. 154(b) by 351 days.

(21) Appl. No.: 15/184,651

(22) Filed: Jun. 16, 2016

(65) Prior Publication Data

US 2016/0370219 A1 Dec. 22, 2016

(30) Foreign Application Priority Data

Jun. 16, 2015 (FR) ...................................... 15 55464

(51) Int. Cl.
*G01F 23/00* (2006.01)
*G01F 23/26* (2006.01)
(Continued)

(52) U.S. Cl.
CPC .......... *G01F 23/263* (2013.01); *G01F 23/266* (2013.01); *G01F 25/0076* (2013.01); *G01R 27/26* (2013.01)

(58) Field of Classification Search
None
See application file for complete search history.

(56) References Cited

U.S. PATENT DOCUMENTS 4,875,497 A 10/1989 Worthington
5,726,908 A * 3/1998 Hosmer ................ F17C 13/008
361/284

(Continued)

FOREIGN PATENT DOCUMENTS

FR 2892509 A1 4/2007
WO 96/29580 A1 9/1996
WO 2010/092055 A1 8/2010

OTHER PUBLICATIONS

Apr. 29, 2016 French Search Report issued in French Patent Application No. 1555464.

(Continued)

*Primary Examiner* — Peter Macchiarolo
*Assistant Examiner* — Jermaine Jenkins
(74) *Attorney, Agent, or Firm* — Oliff PLC

(57) ABSTRACT

A measurement device has two electrodes in the liquid forming a capacitor the capacitance of which depends on the height of the liquid, a microcontroller connected to an electrode and having a capacitance determination circuit for determining first and second values of the capacitance of the capacitor respectively during charging and discharging of the capacitor, an oscillator circuit for generating signals at a reference frequency when the electrodes are not connected to the microcontroller, then at a variable frequency dependent on the height of the liquid when the electrodes are connected to the microcontroller. The microcontroller further includes a programmable logic device configured into a comparator circuit, and a frequency determination circuit connected to the programmable logic device so as to determine the variable frequency from the reference frequency and from the signals of the programmable logic device.

17 Claims, 5 Drawing Sheets

(51) Int. Cl.
*G01F 25/00* (2006.01)
*G01R 27/26* (2006.01)

(56) References Cited

U.S. PATENT DOCUMENTS

| | | | | |
|---|---|---|---|---|
| 6,237,412 | B1* | 5/2001 | Morimoto | G01F 23/266 |
| | | | | 702/55 |
| 6,823,731 | B1* | 11/2004 | Lin | G01F 23/266 |
| | | | | 116/227 |
| 7,432,725 | B2* | 10/2008 | Sieh | G01F 23/268 |
| | | | | 324/662 |
| 7,509,856 | B1* | 3/2009 | Winkens | G01F 23/265 |
| | | | | 73/304 C |
| 7,802,471 | B2* | 9/2010 | Sieh | G01F 23/265 |
| | | | | 73/304 C |
| 8,789,414 | B2* | 7/2014 | Park | G01F 23/268 |
| | | | | 73/149 |
| 9,182,265 | B1* | 11/2015 | Ward | G01F 23/26 |
| 9,261,395 | B2* | 2/2016 | Shearer | G01F 23/268 |
| 2002/0116999 | A1 | 8/2002 | Heger | |
| 2009/0133491 | A1* | 5/2009 | Lee | G01F 23/268 |
| | | | | 73/304 C |
| 2010/0301878 | A1 | 12/2010 | Armbruster et al. | |
| 2011/0290013 | A1 | 12/2011 | Naydenoy et al. | |
| 2012/0111870 | A1* | 5/2012 | Hodgson | F01N 3/206 |
| | | | | 220/562 |
| 2014/0331763 | A1* | 11/2014 | Robb | G01F 23/266 |
| | | | | 73/304 C |
| 2016/0041021 | A1* | 2/2016 | Saitou | G01F 23/26 |
| | | | | 73/304 C |

OTHER PUBLICATIONS

Resnick G A Halliday et al., "Charge and Discharge of a Capacitor" XP055269497, 1995.

* cited by examiner

DEVICE AND METHOD FOR MEASURING THE HEIGHT OF A LIQUID IN A CONTAINER

The present invention concerns a measurement device for measuring the height of a liquid in a container. In addition, the present invention concerns a measurement method for measuring the height of a liquid in a container.

The present invention applies to the field of measurement of a liquid level in motor vehicles. For example, the liquid may be urea or an aqueous urea solution (sometimes referred to by the trade name AdBlue®). By motor vehicle, are meant notably passenger vehicles, commercial vehicles or industrial vehicles such as trucks for example.

The document US2011290013A1 illustrates a capacitive measurement device for measuring the height of an aqueous urea solution in a container. This capacitive measurement device comprises two immersed electrodes, a microcontroller connected to one of the electrodes and comprising a capacitance determination circuit. The capacitance determination circuit is configured to determine a first value and a second value of a capacitance formed by the electrodes and the liquid from voltages measured between the electrodes respectively during a charging phase and during a discharging phase of the capacitor formed by the electrodes and the liquid.

However, a measurement device of the prior art requires permanently subjecting the electrodes to a potential difference. Still, a permanent or residual potential difference induces a permanent energy consumption. In addition, this permanent potential difference may accumulate negative charges on an electrode, therefore induce the electrolysis of the liquid and the wear of an electrode by oxidation-reduction. Thus, the degradation of the electrodes and of the liquid reduces over time the measurement precision of a measurement device of the prior art.

The present invention aims in particular to resolve all or part of the aforementioned problems.

To this aim, an object of the present invention is a measurement device, for measuring a height of a liquid in a container, the liquid being for example an aqueous urea solution, the measurement device comprising at least:
  two electrodes intended to be at least partially immersed in the liquid when the liquid is introduced in the container, so that the electrodes and the liquid present between the electrodes form a variable capacitor the capacitance of which depends on the height of the liquid in the container,
  a microcontroller configured to be connected to at least one of the electrodes, the microcontroller comprising a capacitance determination circuit configured to determine:
  i) a first value of the capacitance of the variable capacitor from voltages measured between the electrodes during a charging phase of the variable capacitor, and
  ii) a second value of the capacitance of the variable capacitor from voltages measured between the electrodes during a discharging phase of the variable capacitor,
  wherein the measurement device further comprises an oscillator circuit configured:
  i) to generate signals at a reference frequency when the electrodes are not connected to the microcontroller, and
  ii) to generate signals at a variable frequency dependent on the height of the liquid in the container when the electrodes are connected to the microcontroller and immersed in the liquid;
  the microcontroller further comprising:
  a programmable logic device configured to form an inverter logic gate, the inverter logic gate being arranged to induce voltage oscillations at the variable frequency in the oscillator circuit, and
  a frequency determination circuit connected to the programmable logic device and configured to determine the variable frequency from the reference frequency and from the signals derived from the programmable logic device.

Thus, such a measurement device allows measuring the height of the liquid in the container with a great accuracy over a wide range of heights of the liquid. Indeed, the capacitance of the variable capacitor is determined successively according to two methods, which enhances the robustness of the capacitive measurement. With the first method, the capacitance of the liquid is determined by measuring charging and discharging voltages, then, with the second method, the capacitance of the liquid is determined by measuring frequencies.

After having determined the capacitance of the variable capacitor by these measurements, it is possible to calculate the capacitance of the liquid in the container, then to deduce therefrom the height of the liquid in the container.

After having determined the variable frequency, it is possible to calculate the capacitance of the variable capacitor, then to deduce therefrom the capacitance of the liquid, therefore the height of the liquid in the container.

In addition, such a measurement device avoids the need for subjecting the electrodes and the liquid to a permanent potential difference, which reduces the energy consumption and avoids the electrolysis of the liquid and the wear of the electrodes by oxidation-reduction.

Moreover, such a measurement device allows diagnosing the correct or defective operation of the measurement device. Indeed, the measurement device allows making two distinct measurements in order to determine the height of the liquid. Hence, one of the measurements (variable frequency, variable capacitance) may serve to determine the height of the liquid, while the other measurement (variable capacitance, variable frequency) may serve to check that the measurement device operates correctly, by assessing the difference between the two measurements. When the absolute value of the difference between the two measurements becomes higher than a predetermined failure threshold, the measurement device is considered to be defective and an error message may be transmitted to the central unit of the motor vehicle.

In the present application, the term <<connect>> and its derivatives refer to a connection allowing the passage of an electric current. Two elements may be connected via zero, one or several component(s).

The capacitance of the variable capacitor formed by the electrodes and the liquid depends on the height of the liquid in the container, because this capacitance is a function of the surface area of the wet portion of the outer surface of the electrodes, that it is to say, the portion which is in contact with the liquid. Still, this surface area of the wet portion increases when the height of the liquid in the container increases.

According to a variant, the programmable logic device, also termed programmable logic circuit, may be formed by a Configurable Logic Cell or CLC.

According to a variant, the inverter logic gate is formed by an inverter circuit with a Schmitt comparator input (sometimes referred to as <<Schmitt trigger>>).

According to an embodiment, the microcontroller is configured to generate:

a first measurement signal which is formed from the first and second values of the capacitance of the variable capacitor so that the first measurement signal is representative of the height of the liquid; and a second measurement signal which is formed from the variable frequency so that the second measurement signal is representative of the height of the liquid;

the microcontroller being further configured to generate a height signal which is formed:

from the first measurement signal when the first measurement signal corresponds to a height of liquid which is larger than a predetermined height threshold; or from a second measurement signal when the first measurement signal corresponds to a height of liquid which is smaller than the predetermined height threshold.

In other words, in order to calculate the instantaneous height of the liquid, only one of the two measurements performed by the microcontroller is retained according to whether the height of the liquid is large or small. When the level of liquid is high (for example between 100% and 50% of the maximum height of the liquid), the measurement device uses measurements of charging and discharging capacitances; afterwards, when the level of liquid is low (for example between 50% and 0% of the maximum height of the liquid), the measurement device uses measurements of frequencies. The switch between the two uses depends on the level of liquid with a predetermined threshold (for example 50%) which may be a frequency value or a capacitance value.

Thus, the measurement device may provide accurate measurements over a wide range of heights of the liquid. Indeed, the first measurement signal (variable capacitance) is more accurate or more precise than the second measurement signal because the height of the liquid is large; whereas the second measurement signal (variable frequency) is more accurate than the first measurement signal when the height of the liquid is small.

Indeed, when the height of the liquid is large, the capacitance of the variable capacitor is relatively high, therefore, its measurement uncertainty is low, while the variable frequency is relatively low, therefore, its measurement uncertainty is high and the duration of a frequency measurement is long. Conversely, when the height of the liquid is small, the variable frequency is relatively high, therefore, its measurement uncertainty is low and the duration of a frequency measurement is short, while the capacitance of the variable capacitor is relatively low, therefore, its measurement uncertainty is high.

The microcontroller software makes a choice between the two measurement signals based on the measured signal resulting from the frequency measurement. Below a predetermined frequency threshold, the height of the liquid is calculated from the measurement signal resulting from the capacitance measurement (during charging and discharging phases). Above this predetermined threshold, the height of the liquid is calculated from the measurement signal resulting from the frequency measurement.

According to a variant, the microcontroller is configured to record a parameter representative of the maximum height of the liquid in the container, the height threshold being a predetermined proportion of the maximum height of the liquid in the container. For example, said predetermined proportion may be comprised between 25% and 75%, for example between 40% and 60%.

More generally, the predetermined height threshold should be selected based on the liquid the height of which is to be measured, therefore based on the application provided for the measurement device.

According to an embodiment, the frequency determination circuit comprises:

a counter configured to count the number of oscillations of the oscillator circuit for a predetermined duration, and a phase-locked loop configured to generate stable-frequency signals so as to define a time base.

Thus, such a frequency determination circuit, with a phase-locked loop, allows determining the frequencies with a great accuracy. A Phase-Locked Loop is also referred to by the acronym <<PLL>>.

Indeed, the phase-locked loop increments with precision the time base of the measurement of the variable frequency of the oscillator circuit, the counter measuring the variable frequency. For example, this phase-locked loop multiplies by four the frequency of the oscillator circuit in the microcontroller.

According to a variant, the counter is configured to be incremented either during the rising edges or during the falling edges. The predetermined duration, usually called the time base, is comprised between 100 ms and 1000 ms. This time base is defined by the phase-locked loop.

According to an embodiment, the phase-locked loop is configured to operate at a stable frequency comprised between 8 MHz and 32 MHz, for example equal to 16 MHz, and the phase-locked loop is configured to increment the counter according to a period comprised between 125 nanoseconds and 31.25 nanoseconds, preferably substantially equal to 62.5 nanoseconds.

Thus, such a phase-locked loop allows enhancing the accuracy of the measurement of the height of the liquid.

According to an embodiment, the measurement device further comprises a communication module configured to generate radioelectric signals representative of the height of the liquid in the container, the radioelectric signals being for example of the radio-identification (RFID) type.

Thus, the measurement device may transmit the measured heights of the liquid to a central unit, which avoids any wired connection, therefore any mechanical connection, between the inside and the outside of the container. In particular, the measurement device may be electrically fed by the radioelectric signals (passive RFID). Thus, the tightness of the container is reliable, because no connection has to pass through the walls of the container in order to reach the measurement device which is located in the container.

According to an embodiment, the programmable logic device comprises an inverter circuit with a Schmitt comparator input.

Thus, such an inverter circuit with a Schmitt comparator input allows obtaining an oscillator circuit which is stable and in which the analog noise is eliminated.

According to an embodiment, the microcontroller further comprises an analog-digital converter connected to the capacitance determination circuit, the analog-digital converter being configured to perform analog measurements of said voltages measured between the electrodes.

Thus, such an analog-digital converter allows determining the voltages with a great precision, which enhances the accuracy of the measurement of the height of the liquid during the charging and discharging phases of the variable capacitor formed by the electrodes and by the liquid present between the electrodes.

According to an embodiment, the capacitance determination circuit is configured:

i) to determine the first value of the capacitance of the variable capacitor from at least two voltages measured between the electrodes at respective instants during the charging phase of the variable capacitor, and ii) to determine the second value of the capacitance of the variable capacitor from at least two voltages measured between the electrodes at two respective instants during the discharging phase of the variable capacitor.

Thus, such a capacitance determination circuit allows determining the voltages with a great precision, which enhances the accuracy of the measurement of the height of the liquid.

According to an embodiment, the electrodes are distant from each other, and the electrodes are formed by cylinders having axes parallel to each other and, for example, circular bases.

Thus, such electrodes simplify the manufacture of the measurement device, as well as the programming of the calculations to be performed from the microcontroller.

According to a variant, the electrodes are composed of stainless steel.

According to an embodiment, the microcontroller further comprises a temperature sensor, and the microcontroller is configured to apply a temperature correction factor on the measurement of the height of the liquid.

Thus, such a temperature sensor allows compensating the variations of the measurement due to the variations of the temperature of the electronic circuits (microcontroller). To this end, a software algorithm may use the measurements transmitted by the temperature sensor. This temperature correction or compensation allows enhancing the accuracy of the measurement of the height of the liquid in the container. The software algorithm may be executed by a central unit or by the microcontroller.

According to a variant, the temperature sensor is a resistor varying with temperature, for example a negative temperature coefficient (NTC) resistor.

According to a variant, the oscillator circuit comprises an oscillator resistor and an oscillator capacitor which are arranged in parallel with the variable capacitor.

According to a variant, the microcontroller may comprise a resistance measuring circuit configured to measure the resistance between the electrodes, which allows enhancing the accuracy of the measurement of the height of the liquid in the container and which allows determining the concentration in the liquid of one of its components, for example the concentration of urea when the liquid is an aqueous urea solution.

In addition, an object of the present invention is a measurement method, for measuring a height of liquid in a container, the liquid being for example an aqueous urea solution, wherein the measurement method comprises at least the steps of:

providing a measurement device according to the invention, generating, by means of the oscillator circuit, signals at a reference frequency when the electrodes are not connected to the microcontroller, connecting the electrodes to the microcontroller, one of the electrodes being connected to the ground, introducing the liquid in the container so as to immerse at least partially the electrodes in the liquid, generating, by means of the oscillator circuit, signals at a variable frequency dependent on the height of the liquid in the container when the electrodes are immersed in the liquid, the voltage oscillations at the variable frequency being induced in the oscillator circuit by the inverter logic gate formed by the programmable logic device, determining, by means of the frequency determination circuit, at least one first value of the variable frequency from the reference frequency and from the signals derived from the programmable logic device, determining, by means of the capacitance determination circuit, a first value of the capacitance of the variable capacitor from voltages measured between the electrodes during a charging phase of the variable capacitor, and determining, by means of the capacitance determination circuit, a second value of the capacitance of the variable capacitor from voltages measured between the electrodes during a discharging phase of the variable capacitor.

Thus, such measurement method allows determining with a great accuracy the height of the liquid in the container. Indeed, the capacitance of the variable capacitor is determined consecutively according to two methods, which enhances the robustness of the capacitive measurement. With the first method, the capacitance of the liquid is determined by measuring charging and discharging voltages, then, with the second method, the capacitance of the liquid is determined by measuring frequencies.

In the present application, the term <<ground>> refers to a reference potential. For example, the reference potential may be 0 V.

According to a variant, the step of determining the first value of the capacitance of the variable capacitor comprises at least a measurement step and at least a calculation step.

According to a variant, the step of determining the second value of the capacitance of the variable capacitor comprises at least a measurement step and at least a calculation step.

According to a variant, the step of determining the variable frequency comprises at least a measurement step and at least a calculation step.

According to an embodiment, the measurement method further comprises the steps of:

generating, by means of the microcontroller, a first measurement signal which is formed from the first and second values of the capacitance of the variable capacitor so that the first measurement signal is representative of the height of the liquid; and generating, by means of the microcontroller, a second measurement signal which is formed from the variable frequency so that the second measurement signal is representative of the height of the liquid;

generating, by means of the microcontroller, a height signal which is formed:

from the first measurement signal when the first measurement signal corresponds to a height of liquid which is larger than a predetermined height threshold; or from the second measurement signal when the first measurement signal corresponds to a height of liquid which is smaller than the predetermined height threshold.

Thus, the measurement device can provide accurate measurements over a wide range of heights of liquid. Indeed, the first measurement signal (variable capacitance) is more accurate or more precise than the second measurement signal when the height of the liquid is large; whereas the second measurement signal (variable frequency) is more accurate than the first measurement signal when the height of the liquid is small.

According to a variant, the measurement method further comprises a storage step, in which the microcontroller records a parameter representative of the maximum height of the liquid in the container, the height threshold being a predetermined proportion of the maximum height of the liquid in the container. For example, said predetermined proportion may be comprised between 25% and 75%, for example between 40% and 60%.

According to an embodiment, the measurement method further comprises the steps of:
disconnecting the electrode initially connected to the ground,
bringing the thus disconnected electrode to a positive potential, for example a 5 V potential, and
generating again, by means of the oscillator circuit, signals at a variable frequency dependent on the height of the liquid in the container when the electrodes are immersed in the liquid, the voltage oscillations at the variable frequency being induced in the oscillator circuit by the inverter logic gate formed by the programmable logic device.

According to an embodiment, the measurement method further comprises the steps of:
determining, by means of the frequency determination circuit, at least one second value of the variable frequency from the reference frequency and from the signals derived from the programmable logic device, and
calculating an average value of the variable frequency from the first value of the variable frequency and from the second value of the variable frequency.

Thus, the average value of the variable frequency allows calculating the height of the liquid. These steps allow enhancing the accuracy of the measurement of the height of the liquid and avoiding the accumulation of negative charges on the same electrode. Indeed, the accuracy is enhanced, because the first value and the second value of the variable frequency are used.

According to an variant, the step of determining the second value of the variable frequency comprises at least a measurement step and at least a calculation step.

According to an embodiment, the measurement method further comprises a step consisting in connecting each electrode to the ground.

Thus, these connections to the ground allow electrically discharging the liquid and cancelling the potential difference generated between the electrodes during the preceding steps. The electrodes may remain grounded for a predetermined duration, for example during the determination steps, the calculation steps and the steps of transmitting the results (measurements and calculations) to a central unit.

In addition, the electrodes may remain grounded when not performing any measurement. For example, the measurements may be performed only when the motor vehicle is stationary or only when running at a constant speed, which avoids disturbances due to waves in the aqueous urea solution.

According to a variant, the measurement method may comprise a step consisting in temporarily deactivating the programmable logic device. Thus, such a step allows connecting to the ground the electrode which is initially connected to the programmable logic device.

According to an embodiment, the frequency determination circuit comprises:

a counter configured to count the number of oscillations of the oscillator circuit for a predetermined duration, and
a phase-locked loop configured to generate stable-frequency signals so as to define a time base;
the microcontroller further comprises an analog-digital converter connected to the capacitance determination circuit, the analog-digital converter being configured to perform analog measurements of said voltages measured between the electrodes,
and the capacitance determination circuit is configured:
i) to determine the first value of the capacitance of the variable capacitor from at least two voltages measured between the electrodes at respective instants during the charging phase of the variable capacitor, and
ii) to determine the second value of the capacitance of the variable capacitor from at least two voltages measured between the electrodes at two respective instants during the discharging phase of the variable capacitor;
and the measurement method further comprises the steps of:
resetting the time base defined by the phase-locked loop,
connecting an electrode to the analog-digital converter and connecting an electrode to the ground,
determining, by means of the capacitance determination circuit, the first value of the capacitance of the variable capacitor from at least two voltages measured between the electrodes at two respective instants during the charging phase of the variable capacitor, the voltages being converted into digital values by the analog-digital converter,
resetting the time base defined by the phase-locked loop, and
determining, by means of the capacitance determination circuit, the second value of the capacitance of the variable capacitor from at least two voltages measured between the electrodes at respective instants during the discharging phase of the variable capacitor, said voltages being converted into digital values by the analog-digital converter.

According to a variant, the instants during the charging phase of the variable capacitor are selected between 0 and 1000 milliseconds. For example, the instants during the charging phase of the variable capacitor are set to 100 milliseconds and to 300 milliseconds.

According to a variant, the instants during the discharging phase of the variable capacitor are selected between 0 and 1000 milliseconds. For example, the instants during the discharging phase of the variable capacitor are set to 100 milliseconds and to 300 milliseconds.

According to an embodiment, the measurement device further comprises an oscillator resistor and an oscillator capacitor, charging of the variable capacitor and discharging of the variable capacitor being carried out through the oscillator resistor, and
during the charging phase of the variable capacitor, the oscillator resistor is brought to a positive potential, for example to a 5 V potential, and
during the discharging phase of the variable capacitor, the oscillator resistor is connected to the ground.

According to a variant, the time base is reset when the oscillator resistor is connected to the ground.

The embodiments and the variants mentioned hereinbefore may be considered separately or according to any technically permissible combination.

The present invention will be better understood and its advantages will appear in the light of the description that follows, given only as a non-limiting example and made with reference to the appended drawings, in which.

FIGS. 1, 2, 3, 4, 5, 6, 7, 8, 9 and 10 illustrate a measurement device 1, for measuring the height $H_U$ of the liquid U in a container 4. The liquid U herein is an aqueous urea solution.

The measurement device 1 comprises two electrodes 11 and 12 which are intended to be immersed, totally or partially, in the liquid U when the liquid U is introduced in the container 4. The electrodes 11 and 12 herein are composed of stainless steel. After immersion, the electrodes 11 and 12 and the liquid U present between the electrodes 11 and 12 form a variable capacitor the capacitance $C_T$ of which depends in particular on the height $H_U$ of the liquid U in the container 4 and on the capacitance $C_R$ of a reference capacitor $C_R$. Since these capacitors are in parallel, the capacitance $C_T$ of the variable capacitor corresponds to the sum of the capacitance $C_R$ of the reference capacitor $C_R$, of the capacitance $C_U$ of the liquid U and of the capacitance $C_A$ of the air surrounding the electrodes.

Figure 4:
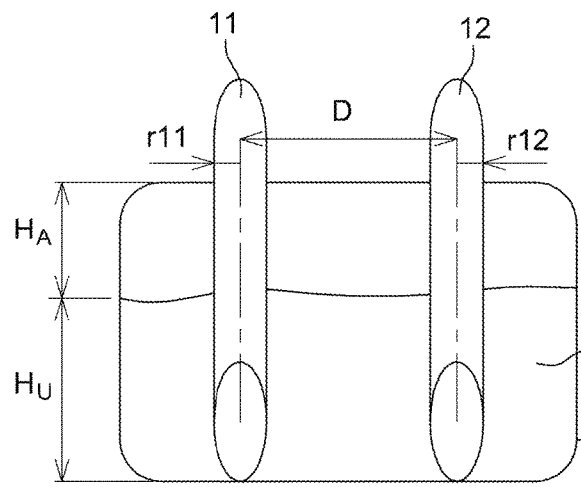
FIG. 4 is a schematic view of a portion of the measurement device of FIG. 2 which is different from FIG. 1.
Figure 5:
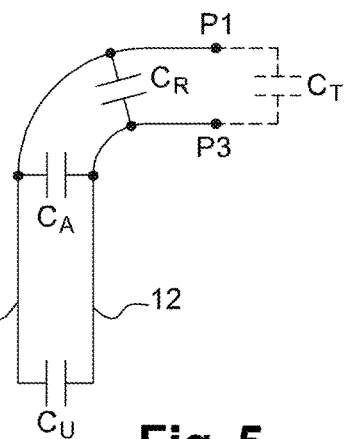
FIG. 5 is a schematic view symbolizing the portion of the measurement device of FIG. 4.

As is shown in FIG. 4, when in service, the container 4 contains air above the liquid U, with a height of air $H_A$ which is variable. As shown in FIG. 5, the emerging portions of the electrodes 11 and 12 and the air form a secondary capacitor $C_A$ the capacitance of which depends on the height of air $H_A$.

In the example of FIGS. 1 to 5, the electrodes 11 and 12 are distant from each other. The electrodes 11 and 12 herein are formed by cylinders having axes parallel to each other and by circular bases. The radius of the cylinder forming the electrode 11 is denoted $r_{11}$ and the radius of the cylinder forming the electrode 12 is denoted $r_{12}$. The distance between the electrodes 11 and 12 is denoted D. Each radius $r_{11}$ and $r_{12}$ may be equal to about 2 mm. The distance D may be comprised between 1 and 8 times the radius $r_{11}$ or $r_{12}$ of the rods 11 and 12. In the example of FIGS. 1 to 5, the distance D herein is equal to about 10 mm.

Figure 2:
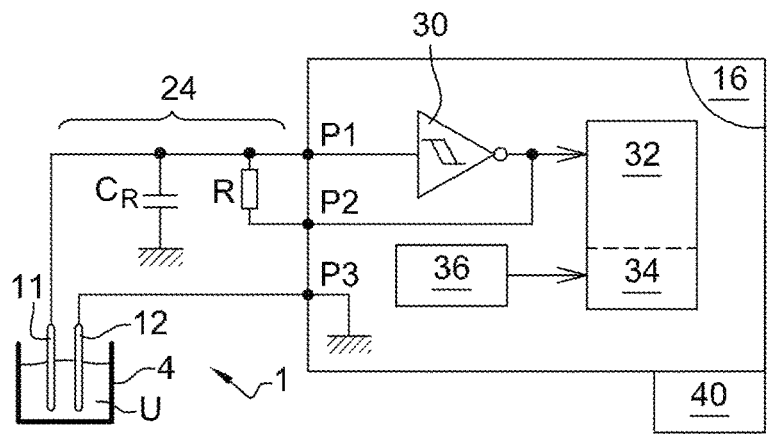
FIG. 2 is a schematic view of the measurement device of FIG. 1, during a step of a measurement method according to the invention.
Figure 3:
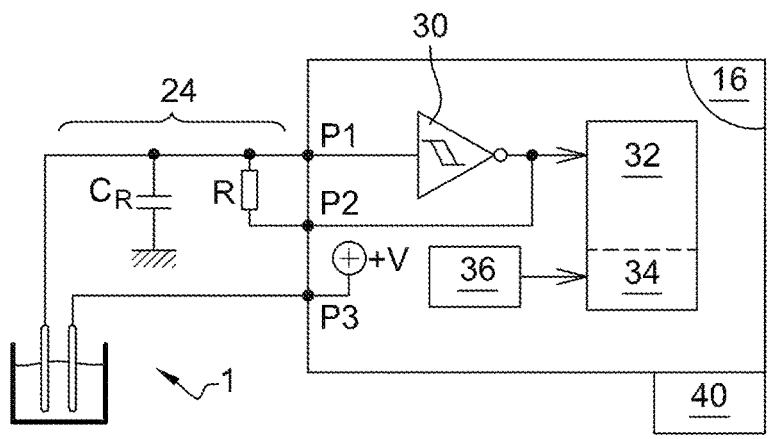
FIG. 3 is a schematic view of the measurement device of FIG. 2, during a subsequent step of the measurement method.

In addition, the measurement device 1 comprises a microcontroller 16 which is configured to be directly or indirectly connected to each electrode 11 and 12. In the example of FIGS. 2 and 3, when in service, the microcontroller 16 is connected directly to each electrode 11 and 12. In particular, the microcontroller 16 has three inputs-outputs P1, P2 and P3. The electrode 11 is connected to the input-output P1 and the electrode 12 is connected to the input-output P3.

Figure 7:
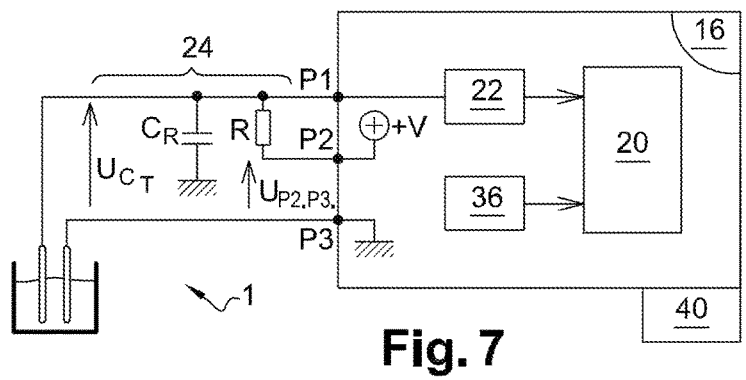
FIG. 7 is a schematic view of the measurement device of FIG. 2, during a subsequent step of the measurement method.
Figure 8:
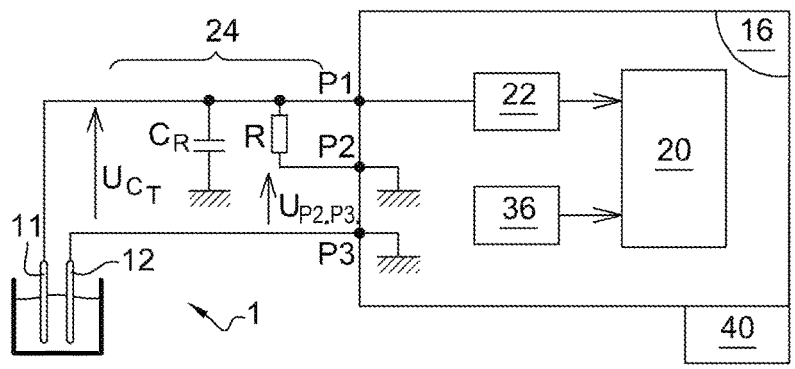
FIG. 8 is a schematic view of the measurement device of FIG. 2, during a subsequent step of the measurement method.

As shown in FIGS. 7 and 8, the microcontroller 16 comprises a capacitance determination circuit 20 configured to determine:

i) a first value of the capacitance of the variable capacitor $C_T$ from at least two voltages measured at respective instants between the electrodes 11 and 12 during a charging phase of the variable capacitor $C_T$, and ii) a second value of the capacitance of the variable capacitor $C_T$ from at least two voltages measured at respective instants between the electrodes during a discharging phase of the variable capacitor $C_T$.

In the microcontroller 16, a time base is defined by a phase-locked loop 36 for determining these respective instants. In this instance, the instants during the charging phase of the variable capacitor $C_T$ are set to 100 milliseconds and to 300 milliseconds. Similarly, the instants during the discharging phase of the variable capacitor $C_T$ are set to 100 milliseconds and to 300 milliseconds.

The microcontroller 16 further comprises an analog-digital converter 22 which is connected to the capacitance determination circuit 20. The analog-digital converter 22 is configured to perform analog measurements of the voltages measured between the electrodes 11 and 12, in order to determine the first value and the second value of the capacitance of the variable capacitor $C_T$.

Moreover, the measurement device 1 comprises an oscillator circuit 24, which has in particular the function of defining a reference frequency. To this end, the oscillator circuit 24 comprises an oscillator resistor R and an oscillator capacitor $C_R$. The oscillator resistor R and the oscillator capacitor $C_R$ herein are arranged in parallel with the capacitor formed by the capacitance $C_U$ of the liquid U.

The oscillator circuit 24 is configured:

i) to generate signals at a reference frequency $f_R$ when the electrodes 11 and 12 are not connected to the microcontroller 16 (FIG. 1), and ii) to generate signals at a variable frequency dependent on the height $H_U$ of the liquid U in the container 4 when the electrodes 11 and 12 are connected to the microcontroller 16 and immersed in the liquid U (FIG. 2).

The microcontroller 16 further comprises a programmable logic device 30. The programmable logic device 30 herein is formed by a configurable logic cell (CLC). The programmable logic device 30 herein forms the oscillator circuit 24, with the oscillator resistor R and the oscillator capacitor $C_R$.

The programmable logic device 30 is configured to form an inverter logic gate. This inverter logic gate is arranged so as to induce voltage oscillations at the variable frequency in the oscillator circuit 24.

Figure 1:
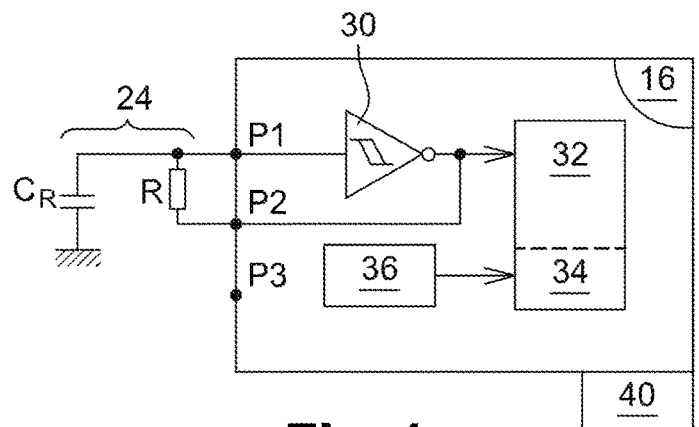
FIG. 1 is a schematic view of a portion of a measurement device according to the invention.

In the example of FIGS. 1 to 3, this inverter logic gate comprises an inverter circuit with a Schmitt comparator input. In a manner known per se, the inverter circuit with a Schmitt comparator input comprises an operational amplifier and a feedback loop with a resistor connected to the non-inverting input of the operational amplifier. The inverter circuit with a Schmitt comparator input operates in a saturated mode.

Furthermore, the microcontroller 16 comprises a frequency determination circuit 32 which is connected to the inverter logic gate formed by the programmable logic device 30. The frequency determination circuit 32 is configured to determine the variable frequency from the signals derived from the programmable logic device 30 and from the reference frequency defined by the oscillator circuit 24.

The frequency determination circuit 32 herein comprises a counter 34 and a phase-locked loop 36. A Phase-Locked Loop is sometimes referred to by the acronym (PLL).

The counter 34 is configured to be incremented either at each rising edge or at each falling edge of the signal derived from the programmable logic device 30. The counter 34 counts for a predetermined duration t, which begins at the startup of the counter 34 and which ends upon stopping of the counter 34. The counter 34 is clocked by the phase-locked loop 36 (PLL).

The phase-locked loop 36 is configured to generate stable-frequency signals so as to define a time base. In the example of FIGS. 1 to 3, the time base is a period equal to about 62.5 nanoseconds. The phase-locked loop 36 is configured to operate at a stable frequency equal to about 16 MHz.

Moreover, the measurement device 1 further comprises a communication module 40, which is configured to generate radioelectric signals representative of the height $H_U$ of the liquid U in the container 4. These radioelectric signals herein are of the radio-identification (RFID) type.

In addition, the measurement device 1 comprises a temperature sensor 42, which herein is formed by a negative temperature coefficient (NTC) resistor. The temperature sensor 42 is placed on the same electronic board as the microcontroller 16.

The microcontroller 16 comprises a temperature measuring circuit 44, which is connected to the temperature sensor 42 via the analog-digital converter 22. After determining the temperature of the liquid U, the microcontroller 16 is configured to apply a temperature correction factor on the measurement of the height $H_U$ of the liquid U.

The calculation of the capacitance of the variable capacitor $C_T$ allows determining the height $H_U$ of the liquid U by applying the following equations (E1) to (E7):

$$C_T = C_R + C_A + C_U \tag{E1}$$

$C_R$ (in F) is a reference capacitance measured when the electrodes 11 and 12 are not connected to the microcontroller 16 (FIG. 1); in this instance $C_R$ is about 100 nF; $C_A$ (in F) is the capacitance of air, which is insignificant; $C_U$ (in F) is the capacitance of the liquid U present around the electrodes 11 and 12.

Since the capacitance of air $C_A$ is insignificant, the equation (E2) may be simplified into:

$$C_U = C_T - C_R \tag{E3}$$

Modelling of the measurement device 1 gives the following equation:

$$\frac{C_U}{H_U} = \frac{2 \cdot \pi \cdot \varepsilon}{\cosh^{-1}\left(\frac{D^2 - r_{11}^2 - r_{12}^2}{2 \cdot r_{11} \cdot r_{12}}\right)} \tag{E4}$$

where: $H_U$ (in m) is the height of the liquid U in which are immersed portions of the electrodes 11 and 12; $\varepsilon$ is the permittivity of the medium to be measured, herein of the liquid U which is an aqueous urea solution.

$$\text{With: } \varepsilon = \varepsilon_0 + \varepsilon_r \tag{E5}$$

where: $r_{11}$ (in m) is the radius of the electrode 11; $r_{12}$ (in m) is the radius of the electrode 12 which is immersed in the liquid U and coupled to the electrode 11; D (in m) is the distance separating the electrodes 11 and 12; $\varepsilon_0$ is the vacuum permittivity; $\varepsilon_r$ is the relative permittivity of the medium to be measured, herein of the liquid U.

From the equation (E4), the following equation is obtained:

$$H_U = \frac{C_U \cdot \cosh^{-1}\left(\frac{D^2 - r_{11}^2 - r_{12}^2}{2 \cdot r_{11} \cdot r_{12}}\right)}{2 \cdot \pi \cdot \varepsilon} \tag{E6}$$

Thus, the calculation of the capacitance of the variable capacitor $C_T$ allows determining the height $H_U$ of the liquid U.

Figure 11:
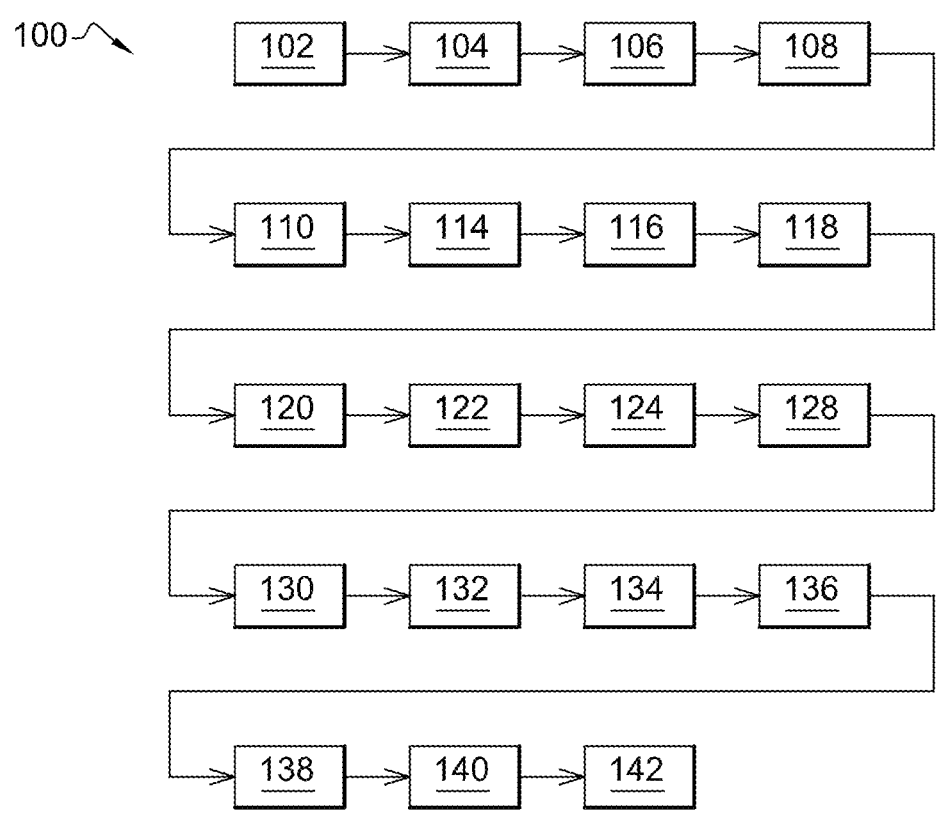
FIG. 11 is a flowchart illustrating the measurement method according to the invention.

Moreover, when the measurement device 1 is in service, it is controlled following the measurement method 100 illustrated in FIG. 11, for measuring the height $H_U$ of the liquid U in a container 4.

When the measurement device 1 is in service, the measurement method 100 comprises the steps of:
102) providing the measurement device 1,
104) generating, by means of the oscillator circuit 24, signals at a reference frequency when the electrodes 11 and 12 are not connected to the microcontroller 16 (FIG. 1); the reference frequency intervenes in the following equations (E10) to (E11):

$$f_R = \frac{1}{0,7.R \cdot C_R} \tag{E10}$$

where: $f_R$ is the reference frequency, R is the oscillator resistor, $C_R$ is the capacitance of the oscillator capacitor $C_R$.

$$\text{Then: } f_R = \frac{1}{Ncounter.62,5.10^{-9}} \tag{E11}$$

where: Ncounter is the number of oscillations counted by the counter during the predetermined duration t; $62,5.10^{-9}$ (s) is the period of oscillation of the phase-locked loop 36, which herein is $T=1/(16.10^6)$, because the frequency of oscillation of the phase-locked loop herein is set to 16 MHz.

Knowing the reference frequency $f_R$, the equations (E10) and (E11) give:

$$C_T = \frac{Ncounter.62,5.10^{-9}}{0,7.R} \tag{E12}$$

Hence, the equations (E3) and (E12) allow expressing $C_U$:

$$C_U = \frac{Ncounter.62,5.10^{-9}}{0,7.R} - C_R \tag{E12.1}$$

106) connecting the electrodes 11 and 12 to the microcontroller 16, respectively on the inputs-outputs P1 and P3, the electrode 12 being connected to the ground, 108) introducing the liquid U in the container 4 so as to immerse at least partially the electrodes 11 and 12 in the liquid U, by raising the level of the liquid U, 110) generating, by means of the oscillator circuit 24, signals at a variable frequency dependent on the height $H_U$ of the liquid U in the container 4 when the electrodes 11 and 12 are immersed in the liquid U, the voltages oscillations at the variable frequency being induced in the oscillator circuit 24 by the inverter logic gate formed by the programmable logic device 30.

By combining the equations (E6) and (E12), the equation (E13) is obtained:

$$H_U = \frac{\left[\left(\frac{Ncounter.62,5.10^{-9}}{0,7.R}\right) - C_R\right] \cdot \cosh^{-1}\left(\frac{D^2 - r_{11}^2 - r_{12}^2}{2 \cdot r_{11} \cdot r_{12}}\right)}{2 \cdot \pi \cdot \varepsilon}$$

114) determining, by means of the frequency determination circuit 32, a first value of the variable frequency from the reference frequency $f_R$ and from the signals derived from the programmable logic device 30, 116) determining, by means of the capacitance determination circuit 20, a first value of the capacitance of the variable capacitor $C_T$ from voltages measured, at the instants 100 ms and 300 ms, between the electrodes 11 and 12 during a charging phase of the variable capacitor $C_T$, and 118) determining, by means of the capacitance determination circuit 20, a second value of the capacitance of the variable capacitor $C_T$ from voltages measured, at the instants 100 ms and 300 ms, between the electrodes 11 and 12 during a discharging phase of the variable capacitor $C_T$.

After having determined the capacitance of the variable capacitor $C_T$ by the measurements during the charging and discharging phases, it is possible to calculate the capacitance $C_U$ of the liquid U in the container 4, then deduce therefrom the height $H_U$ of the liquid U in the container 4.

In addition, the measurement method 100 comprises the steps of:

120) disconnecting the electrode 12 from the ground to which the electrode 12 has been initially connected, 122) bringing the thus disconnected electrode to a positive potential (on the input-output P3), for example to a 5 V potential, as shown by the comparison of FIGS. 2 and 3, and 124) generating again, by means of the oscillator circuit 24, signals at a variable frequency dependent on the height $H_U$ of the liquid U in the container 4 when the electrodes 11 and 12 are immersed in the liquid U.

128) determining, by means of the frequency determination circuit 32, at least one second value of the variable frequency from the reference frequency $f_R$ and from the signals derived from the programmable logic device 30, and 130) calculating an average value of the capacitance of the variable capacitor $C_T$ from the first value of the variable frequency and from the second value of the variable frequency.

After having determined the first and second values of variable frequency, it is possible to calculate the capacitance of the variable capacitor $C_T$, then deduce therefrom the capacitance $C_U$ of the liquid U, therefore the height $H_U$ of the liquid U in the container 4.

Figure 6:
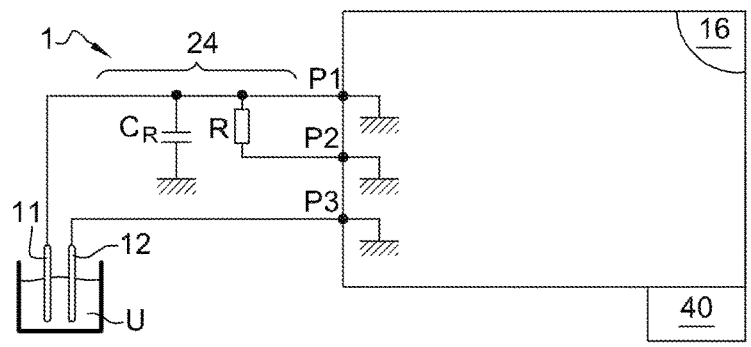
FIG. 6 is a schematic view of the measurement device of FIG. 2, during a subsequent step of the measurement method.

Afterwards, the measurement method 100 further comprises a step 132) consisting in connecting each electrode 11 and 12 to the ground via the inputs-outputs P1, P2 and P3, as is shown in FIG. 6. In order to carry out this step, the software controlling the microcontroller 16 acts on the inputs and/or outputs of the microcontroller 16 so as to configure them into outputs connected to the ground, therefore to a zero potential (GND=0 V). In this instance, the measurement method 100 comprises a step consisting in temporarily deactivating the programmable logic device 30. The step 132) allows connecting to the ground the electrode 11 which is initially connected to the programmable logic device 30.

Each of the determination steps 114), 116), 118) and 128) comprises at least a measurement step and at least a calculation step.

The measurement method 100 further comprises the steps of:

134) resetting the time base defined by the phase-locked loop 36, 136) connecting the electrode 11 to the analog-digital converter 22 and connecting the electrode 12 to the ground via the input-output P3 (FIG. 7), 138) determining, by means of the capacitance determination circuit 20, the first value of the capacitance of the variable capacitor $C_T$ from two voltages measured between the electrodes 11 and 12 at two respective instants during the charging phase of the variable capacitor $C_T$, the voltages being converted into digital values by the analog-digital converter 22, 140) resetting the chronometer 21, and 142) determining, by means of the capacitance determination circuit 22, the second value of the capacitance of the variable capacitor $C_T$ from at least two voltages measured between the electrodes 11 and 12 at respective instants during the discharging phase of the variable capacitor $C_T$, these voltages being converted into digital values by the analog-digital converter 22.

Each of the determination steps 138) and 142) comprises at least a measurement step and at least a calculation step.

In the example of FIG. 11, charging and discharging of the variable capacitor $C_T$ are carried out through the oscillator resistor R.

As is shown in FIG. 7, during the charging phase of the variable capacitor $C_T$, the oscillator resistor R is brought to a positive potential, in this instance equal to 5 V. The time base is reset at the instant when the oscillator resistor R is brought to the 5 V positive potential, that is to say when the oscillator circuit 24 switches into the configuration of FIG. 7.

As is shown in FIG. 8, during the discharging phase of the variable capacitor $C_T$, the oscillator resistor R is connected to the ground, therefore to a zero potential. The time base is also reset at the instant when the oscillator resistor R is connected to the ground, that is to say when the oscillator circuit 24 switches from the configuration of FIG. 7 into the configuration of FIG. 8.

In order to carry out the determination steps 116) and 142), the equations given hereinafter are applied.

First, in the oscillator circuit 24, a voltage $U_{P2.P3}$ is applied between the inputs-outputs P2 and P3. During the charging phase of the variable capacitor, the voltage $U_{P2.P3}$ assumes on a value $U_a$ (FIG. 7), which herein is equal to about 5 V. The charging phase gives the following equation:

$$U_{C_T} = U_a \cdot \left[1 - e^{\left(\frac{-T}{R \cdot C_T}\right)}\right] \quad (E20.1)$$

where:

T (in s) is the duration separating the beginning of the charging or discharging phase and the measurement instant;

$U_{C_T}$ is the voltage at the terminals of the variable capacitor $C_T$ at the end of the duration T; this voltage $U_{C_T}$ is measured between the inputs-outputs P1 and P3 of the microcontroller 16;

$U_a$ is the value of the voltage $U_{P2.P3}$ at the instant when the oscillator resistor R is brought to the positive potential (noted +V in FIG. 7); $U_a$ is for example equal to about 5 V;

$C_T$ is the capacitance of the variable capacitor $C_T$;

R is the value of the oscillator resistor R;

ln symbolizes the natural logarithm.

Then, during the discharging phase of the variable capacitor, the voltage $U_{P2.P3}$ switches from the value $U_a$ to 0 V (FIG. 8). The discharging phase is governed by the following equation:

$$U_{C_T} = U_a \cdot e^{\left(\frac{-T}{R \cdot C_T}\right)} \quad (E20.2)$$

$$\text{therefore: } C_T = \frac{-T}{R \cdot \ln\left(\frac{U_{C_T}}{U_a}\right)} \quad (E21)$$

Thus, the equations (E20.1), (E20.2) and (E21) allow determining the second value of the capacitance of the variable capacitor $C_T$ from the voltages $U_{C_T}$ measured respectively during the charging phase and during the discharging phase. Afterwards, $C_U$ and $H_U$ are deduced from the equation (E3), therefore in the same manner as for the frequency measurement, from the equation (E3): $C_U = C_T - C_R$.

Moreover, the microcontroller 16 is configured to apply a temperature correction factor on the measurement of the height $H_U$ of the liquid U by using the measurements performed by the temperature sensor 42. This temperature correction or compensation allows enhancing the accuracy of the measurement of the height $H_U$ of the liquid U in the container.

Figure 9:
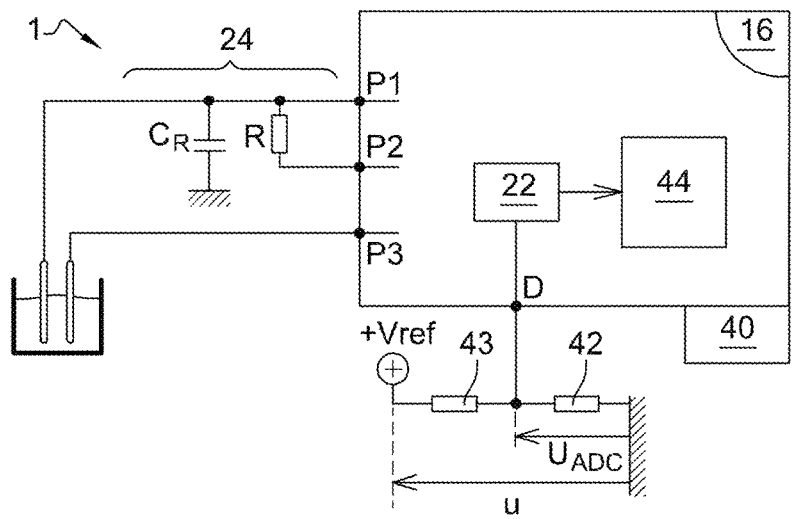
FIG. 9 is a schematic view of the measurement device of FIG. 2, during a subsequent step of the measurement method.
Figure 10:
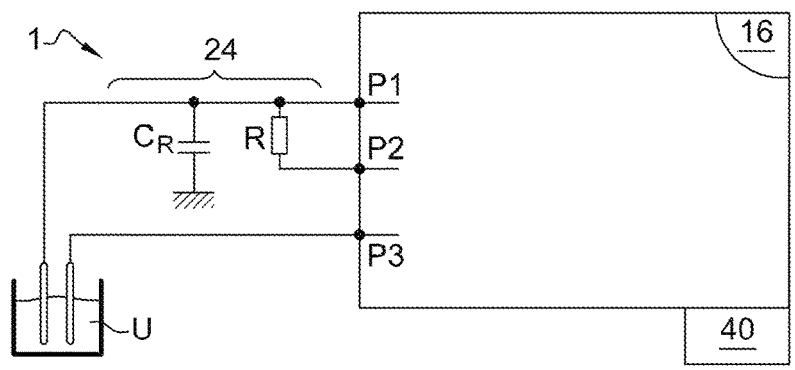
FIG. 10 is a schematic view of the measurement device of FIG. 2, during a subsequent step of the measurement method.

In order to carry out this temperature correction, the following equations may be applied:

$$R_{42} = e^{\left[\left(\frac{1}{Temp+273,15} - \frac{1}{298,15}\right) \cdot 4255 + \ln\left(100 \cdot 10^3\right)\right]} \quad (E22)$$

$$Temp = \frac{1}{\left[\ln\left(\frac{R_{42}}{100 \cdot 10^3}\right) \cdot \frac{1}{4255} + \frac{1}{298,15}\right]} - 1 \quad (E23)$$

$$R_{42} = \frac{R_{43} \cdot U_{ADC}}{u - U_{ADC}} \quad (E24)$$

where:

Temp (in ° C.) is the temperature measured by the temperature sensor 42;

$R_{42}$ is the value of the resistance of the temperature sensor 42 herein formed by a (NTC) thermistor;

$U_{ADC}$ is the voltage measured by the analog-digital converter 22 at the terminals of the temperature sensor 42 (NTC);

u is a power-supply voltage provided by a source noted <<$V_{ref}$>> in FIG. 9;

$R_{43}$ is the value of a resistor 43 which is mounted in series with the temperature sensor 42 (thermistor); $R_{43}$ is constant, whereas $R_{42}$ varies depending on the temperature.

Thus, the equations (E22) to (E24) allow carrying out the temperature correction on the measurement of the height $H_U$ of the liquid U.

Figure 12:
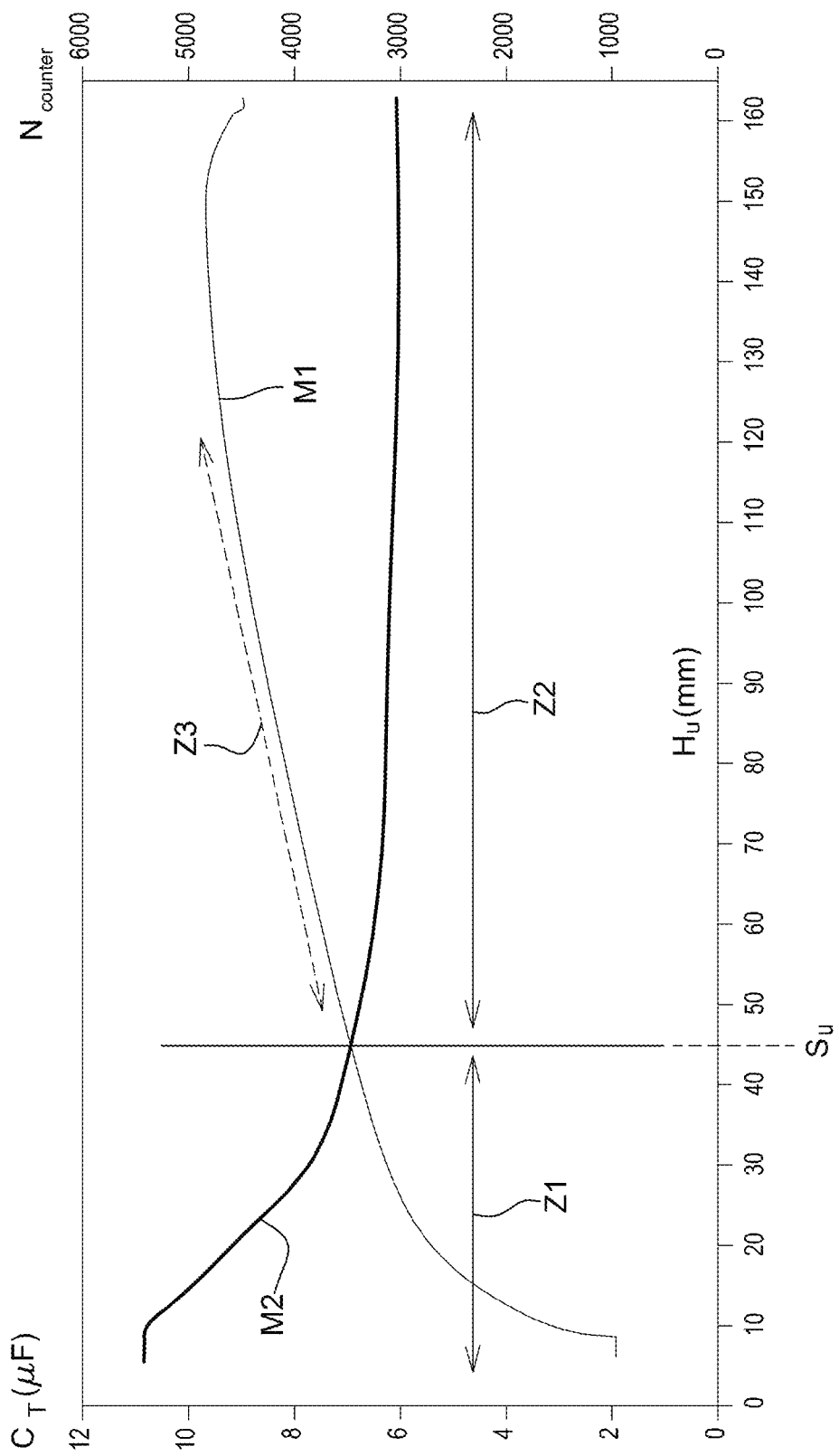
FIG. 12 is a diagram illustrating measurements performed with the measurement device of FIG. 1 and following the measurement method of FIG. 11.

To sum up, the operation of the measurement device 1 governed by the equations exposed hereinbefore may be represented by the diagram illustrated in FIG. 12. This diagram shows two curves, namely:

on the one hand (in continuous fine line), the capacitance of the variable capacitor $C_T$ (in µF) on the ordinate on the left scale (0 to 12 µF) as a function of the height $H_U$ (in mm) of the liquid U;

on the other hand (in continuous thick line), the counted number of oscillations Ncounter (unitless) on the ordinate on the right scale (0 to 6000) as a function of the height $H_U$ (in mm) of the liquid U; the variable frequency is proportional to the counted number of oscillations Ncounter.

The microcontroller 16 is configured to generate:

a first measurement signal M1 (the curve in continuous fine line) which is formed from the first and second values of the capacitance of the variable capacitor $C_T$ so that the first measurement signal M1 is representative of the height $H_U$ of the liquid U; and a second measurement signal M2 (the curve in continuous thick line) which is formed from the variable frequency, proportional to Ncounter, so that the second measurement signal M2 is representative of the height $H_U$ of the liquid U.

Furthermore, the microcontroller 16 is configured to generate a height signal which is formed:

from the first measurement signal M1 when the first measurement signal corresponds to a height $H_U$ of the liquid U which is larger than a predetermined height threshold $S_U$; or from the second measurement signal M2 when the first measurement signal corresponds to a height $H_U$ of the liquid U which is smaller than the predetermined height threshold $S_U$.

In the example of FIG. 12, the predetermined height threshold $S_U$ is equal to about 45 mm, namely a proportion of 27% (45/164) of the maximum height of the liquid U in the container 4.

Thus, are defined a first measurement area Z1, in which the second measurement signal M2 (variable frequency) forms the height signal, and a second measurement area Z2, in which the first measurement signal M1 (capacitance of the variable capacitor $C_T$) forms the height signal.

Moreover, FIG. 12 shows that the capacitance of the variable capacitor $C_T$ varies linearly based on the height $H_U$ within a linear area Z3. It is in this area that the microcontroller 16 assesses the difference between the first measurement signal M1 and the second measurement signal M2, in order to diagnose the correct or defective operation of the measurement device 1.

Of course, the present invention is not limited to the particular embodiments described in the present patent application, nor is it limited to embodiments within the reach of those skilled in the art. Other embodiments may be considered without departing from the scope of the invention, from any element equivalent to an element indicated in the present patent application.

The invention claimed is:

1. A measurement device, for measuring a height of liquid in a container, the liquid being an aqueous urea solution, the measurement device comprising at least:
   two electrodes intended to be at least partially immersed in the liquid when the liquid is introduced in the container, so that the electrodes and the liquid present between the electrodes form a variable capacitor the capacitance of which depends on the height of the liquid in the container,
   a microcontroller configured to be connected to at least one of the electrodes, the microcontroller comprising a capacitance determination circuit configured to determine:
   i) a first value of the capacitance of the variable capacitor from voltages measured between the electrodes during a charging phase of the variable capacitor, and
   ii) a second value of the capacitance of the variable capacitor from voltages measured between the electrodes during a discharging phase of the variable capacitor,
   wherein the measurement device further comprises an oscillator circuit configured:
   i) to generate signals at a reference frequency when the electrodes are not connected to the microcontroller, and
   ii) to generate signals at a variable frequency dependent on the height of the liquid in the container when the electrodes are connected to the microcontroller and immersed in the liquid;
   the microcontroller further comprising:
   a programmable logic device configured to form an inverter logic gate, the inverter logic gate being arranged so as to induce voltage oscillations at the variable frequency in the oscillator circuit , and
   a frequency determination circuit connected to the programmable logic device and configured to determine the variable frequency from the reference frequency and from the signals derived from the programmable logic device .

2. The measurement device according to claim 1, wherein the microcontroller is configured to generate:
   a first measurement signal which is formed from the first and second values of the capacitance of the variable capacitor so that the first measurement signal is representative of the height of the liquid; and
   a second measurement signal which is formed from the variable frequency so that the second measurement signal is representative of the height of the liquid;
   the microcontroller being further configured to generate a height signal which is formed:
   from the first measurement signal when the first measurement signal corresponds to a height of liquid which is larger than a predetermined height threshold; or
   from the second measurement signal when the first measurement signal corresponds to a height of liquid which is smaller than the predetermined height threshold.

3. The measurement device according to claim 1, wherein the frequency determination circuit comprises:
   a counter configured to count the number of oscillations of the oscillator circuit for a predetermined duration, and
   a phase-locked loop configured to generate stable-frequency signals so as to define a time base.

4. The measurement device according to claim 3, wherein the phase-locked loop is configured to operate at a stable frequency comprised between 8 MHz and 32 MHz and wherein the phase-locked loop is configured to increment the counter according to a period comprised between 125 nanoseconds and 31.25 nanoseconds.

5. The measurement device according to claim 1, further comprising a communication module configured to generate radioelectric signals representative of the height of the liquid in the container.

6. The measurement device according to claim 1, wherein the programmable logic device comprises an inverter circuit with a Schmitt comparator input.

7. The measurement device according to claim 1, wherein the microcontroller further comprises an analog-digital converter connected to the capacitance determination circuit, the analog-digital converter being configured to perform analog measurements of said voltages measured between the electrodes.

8. The measurement device according to claim 1, wherein the capacitance determination circuit is configured:
   i) to determine the first value of the capacitance of the variable capacitor from at least two voltages measured between the electrodes at respective instants during the charging phase of the variable capacitor, and
   ii) to determine the second value of the capacitance of the variable capacitor from at least two voltages measured between the electrodes at two respective instants during the discharging phase of the variable capacitor.

9. The measurement device according to claim 1, wherein the electrodes are distant from each other, and wherein the electrodes are formed by cylinders having axes parallel to each other.

10. The measurement device according to claim 1, wherein the microcontroller further comprises a temperature sensor, and wherein the microcontroller is configured to apply a temperature correction factor on the measurement of the height of the liquid.

11. A measurement method, for measuring a height of liquid in a container, the liquid being an aqueous urea solution, wherein the measurement method comprises at least the steps of:
   providing a measurement device according to claim 1,
   generating, by means of the oscillator circuit, signals at a reference frequency when the electrodes are not connected to the microcontroller,
   connecting the electrodes to the microcontroller, one of the electrodes being connected to the ground,
   introducing the liquid in the container so as to immerse at least partially the electrodes in the liquid,
   generating, by means of the oscillator circuit, signals at a variable frequency dependent on the height of the liquid in the container when the electrodes are immersed in the liquid, the voltage oscillations at the variable frequency being induced in the oscillator circuit by the inverter logic gate formed by the programmable logic device,
   determining, by means of the frequency determination circuit, at least one first value of the variable frequency from the reference frequency and from the signals obtained from the programmable logic device,
   determining, by means of the capacitance determination circuit, a first value of the capacitance of the variable capacitor from voltages measured between the electrodes during a charging phase of the variable capacitor, and determining, by means of the capacitance determination circuit, a second value of the capacitance of the variable capacitor from voltages measured between the electrodes during a discharging phase of the variable capacitor.

12. The measurement method according to claim 11, further comprising the steps of:
generating, by means of the microcontroller, a first measurement signal which is formed from the first and second values of the capacitance of the variable capacitor so that the first measurement signal is representative of the height of the liquid; and
generating, by means of the microcontroller, a second measurement signal which is formed from the variable frequency so that the second measurement signal is representative of the height of the liquid;
generating, by means of the microcontroller, a height signal which is formed:
from the first measurement signal when the first measurement signal corresponds to a height of liquid which is larger than a predetermined height threshold; or
from the second measurement signal when the first measurement signal corresponds to a height of liquid which is smaller than the predetermined height threshold.

13. The measurement method according to claim 11, further comprising the steps of:
disconnecting the electrode initially connected to the ground,
bringing the thus disconnected electrode to a positive potential, and
generating again, by means of the oscillator circuit, signals at a variable frequency dependent on the height of the liquid in the container when the electrodes are immersed in the liquid, the voltage oscillations at the variable frequency being induced in the oscillator circuit by the inverter logic gate formed by the programmable logic device.

14. The measurement method according to claim 13, further comprising the steps of:
determining, by means of the frequency determination circuit, at least one second value of the variable frequency from the reference frequency and from the signals derived from the programmable logic device, and
calculating an average value of the variable frequency from the first value of the variable frequency and from the second value of the variable frequency.

15. The measurement method according to claim 11, further comprising a step consisting in connecting each electrode to the ground.

16. The measurement method according to claim 11, wherein in the measurement device, the frequency determination circuit comprises:
a counter configured to count the number of oscillations of the oscillator circuit for a predetermined duration, and
a phase-locked loop configured to generate stable-frequency signals so as to define a time base,
the microcontroller further comprises an analog-digital converter connected to the capacitance determination circuit, the analog-digital converter being configured to perform analog measurements of said voltages measured between the electrodes, and
the capacitance determination circuit is configured:
i) to determine the first value of the capacitance of the variable capacitor from at least two voltages measured between the electrodes at respective instants during the charging phase of the variable capacitor, and
ii) to determine the second value of the capacitance of the variable capacitor from at least two voltages measured between the electrodes at two respective instants during the discharging phase of the variable capacitor,
the measurement method further comprising the steps of:
resetting the time base defined by the phase-locked loop,
connecting an electrode to the analog-digital converter and connecting an electrode to the ground,
determining, by means of the capacitance determination circuit, the first value of the capacitance of the variable capacitor from at least two voltages measured between the electrodes at two respective instants during the charging phase of the variable capacitor, the voltages being converted into digital values by the analog-digital converter,
resetting the time base defined by the phase-locked loop, and
determining, by means of the capacitance determination circuit, the second value of the capacitance of the variable capacitor from at least two voltages measured between the electrodes at respective instants during the discharging phase of the variable capacitor, said voltages being converted into digital values by the analog-digital converter.

17. The measurement method according to claim 16, wherein the measurement device further comprises an oscillator resistor and an oscillator capacitor, charging of the variable capacitor and discharging of the variable capacitor being carried out through the oscillator resistor, and wherein:
during the charging phase of the variable capacitor, the oscillator resistor is brought to a positive potential, and
during the discharging phase of the variable capacitor, the oscillator resistor is connected to the ground.

* * * * *